(12) United States Patent
Aonuma et al.

(10) Patent No.: US 7,129,418 B2
(45) Date of Patent: Oct. 31, 2006

(54) SUSPENSION BOARD WITH CIRCUIT AND PRODUCING METHOD THEREOF

(75) Inventors: Hidenori Aonuma, Osaka (JP); Yasuhito Ohwaki, Osaka (JP)

(73) Assignee: Nitto Denko Corporation, Ibaraki (JP)

( * ) Notice: Subject to any disclaimer, the term of this patent is extended or adjusted under 35 U.S.C. 154(b) by 0 days.

(21) Appl. No.: 10/944,827

(22) Filed: Sep. 21, 2004

(65) Prior Publication Data
US 2005/0061542 A1   Mar. 24, 2005

(30) Foreign Application Priority Data
Sep. 22, 2003   (JP) .............................. 2003-329575

(51) Int. Cl.
H05K 1/03   (2006.01)
(52) U.S. Cl. ..................................... 174/255
(58) Field of Classification Search ................ 174/255, 174/72 A
See application file for complete search history.

(56) References Cited

U.S. PATENT DOCUMENTS 6,388,201 B1 *   5/2002   Yamato et al. .............. 174/258
6,841,737 B1 *   1/2005   Komatsubara et al. ...... 174/250
2002/0100609 A1 *   8/2002   Ookawa et al. ............. 174/255

FOREIGN PATENT DOCUMENTS

JP   10-265572   10/1998

* cited by examiner

Primary Examiner—Kamand Cuneo
Assistant Examiner—Yuriy Semenenko
(74) Attorney, Agent, or Firm—Jean C. Edwards; Akerman Senterfitt

(57) ABSTRACT

A suspension board with circuit permits a terminal portion to be formed by electrolysis plating without exposing a conductor layer to outside and a production method thereof. After an insulating base layer is formed on a suspension board in a specific pattern in which a second opening is formed, a thin metal film is formed on the insulating base layer and on the suspension board including the second opening exposed from the insulating base layer. A conductor layer is formed in the form of a wired circuit pattern on the thin metal film. An insulating cover layer is formed with a pad opening therein, and a pad portion formed in the pad opening using the suspension board as a lead portion of the electrolysis plating. A first opening larger than the second opening is formed in the suspension board at a portion thereof corresponding to the second opening.

5 Claims, 7 Drawing Sheets

SUSPENSION BOARD WITH CIRCUIT AND PRODUCING METHOD THEREOF

This application claims priority from Japanese Patent Application No. 2003-329575, filed Sep. 22, 2003, the entire contents of which are herein incorporated by reference to the extent allowed by law.

BACKGROUND OF THE INVENTION

1. Field of the Invention

The present invention relates to a suspension board with circuit and to a producing method thereof. More particularly, the present invention relates to a suspension board with circuit mounting thereon a magnetic head of a hard disc drive and to a producing method thereof.

2. Description of the Prior Art

A suspension board with circuit mounts thereon a magnetic head of a hard disk drive and supports the magnetic head, with a minute interval between the magnetic head and a magnetic disk held against an airflow generated when the magnetic head and the magnetic disk run relative to each other.

A terminal portion of this suspension board with circuit is usually formed by carrying out electrolysis nickel plating and electrolysis gold plating sequentially. When the terminal portion is formed in this plating process, part of a conductor layer of the suspension board with circuit is used as a lead portion of the electrolysis plating.

Specifically, when the terminal portion is formed in the suspension board with circuit, the conductor layer is exposed from a lateral side of a cover layer; the conductor layer thus exposed is used as the lead portion of the electrolysis plating; and after completion of the forming of the terminal portion, the lead portion is removed by etching (Cf. JP Patent Laid-open (Unexamined) Publication No. Hei 10-265572).

However, in the method outlined above, since the conductor layer remains exposed to outside at the end thereof as it is after the removal of the lead portion by etching, there is a possibility that the conductor layer may be corroded from its exposed end portion to cause some defects.

In addition, in the method outlined above, the process of etching the lead portion is indispensable, thus causing increase in the number of processes.

SUMMARY OF THE INVENTION

It is the object of the present invention to provide a producing method of a suspension board with circuit that can permit a terminal portion to be formed by electrolysis plating without exposing a conductor layer to outside and also can reduce the number of processes, and the suspension board with circuit produced by the same producing method.

The present invention provides a suspension board with circuit comprising a metal support layer, an insulating layer formed on the metal support layer, a thin metal film formed on the insulating layer, and a conductor layer formed on the thin metal film, wherein a first opening is formed in the metal support layer, and a second opening is formed in the insulating layer to be encompassed with the first opening without contacting with a periphery of the first opening, and wherein the thin metal film is exposed in the second opening.

In the suspension board with circuit of the present invention, it is preferable that the thin metal film exposed in the second opening is formed so that its surface is flush with a surface of the insulating layer exposed in the first opening.

Also, the present invention provides a method of producing a suspension board with circuit comprising the process of forming an insulating layer having a second opening on a metal support layer, the process of forming a thin metal film on the insulating layer and on the metal support layer exposed in the second opening, the process of forming a conductor layer in the form of a wired circuit pattern on the thin metal film, the process of forming a terminal portion on the conductor layer by electrolysis plating using the metal support layer as a lead portion of the electrolysis plating, and the process of forming the first opening in the metal support layer at a portion thereof corresponding to the second opening so that it can surround the second opening without contacting with a periphery of the second opening.

According to the suspension board with circuit of the present invention thus produced, before the process of forming the first opening, the metal support layer is electrically conductive with the conductor layer via the thin metal film. Hence, the metal support layer can be used as the lead portion of the electrolysis plating for forming the terminal portion in this process. Also, in the suspension board with circuit thus produced, the conductor layer is covered with the thin metal film without being exposed directly from the second opening and thus is prevented from being exposed to outside. This can prevent occurrence of corrosion or defects of the conductor layer effectively.

Also, according to the method of producing a suspension board with circuit of the present invention, before the process of forming the first opening, the metal support layer is electrically conductive with the conductor layer via the thin metal film. Hence, the metal support layer can be used as the lead portion of the electrolysis plating for forming the terminal portion in this process. Also, when the suspension board with circuit is produced in this method, the conductor layer is covered with the thin metal film without being exposed directly from the second opening and thus is prevented from being exposed to outside. This can prevent occurrence of corrosion or defects of the conductor layer effectively.

Besides, since this method does not require the process of removing the lead portion after the terminal portion is formed, the number of processes can be reduced, resulting in improvement in production efficiency and reduction in cost.

BRIEF DESCRIPTION OF THE DRAWINGS

In the drawings.

(a) shows the process of forming an insulating base layer with a second opening into a predetermined pattern on a suspension board.

(b) shows the process of forming a thin metal film over the entire surface of the insulating base layer and on a surface of a suspension board including the second opening exposed from the insulating base layer.

(c) shows the process of forming a conductor layer in the form of a predetermined circuit pattern on the thin metal film.

(d) shows the process of removing the thin metal film exposed from the conductor layer by etching; and (e) shows the process of forming a metal coating on a surface of the conductor layer and on a surface of the suspension board.

(f) shows the process of forming an insulating cover layer to cover the conductor layer in a predetermined pattern including a pad opening portion.

(g) shows the process of stripping the metal coating from the surface of the suspension board and the surface of the metal coating exposed from the pad opening.

(h) shows the process of forming the pad portion on the surface of the conductor layer exposed from the pad opening portion by electrolysis plating; and (i) shows the process of opening a first opening to surround the second opening in the suspension board at a portion thereof corresponding to the second opening.

(a) shows the process of preparing the suspension board.

(b) shows the process of forming a coating on the suspension board.

(c) shows the process of exposing the coating to light.

(d) shows the process of developing the coating; and (e) shows the process of curing the coating.

(a) shows the process of forming on the thin metal film a plating resist having reversed pattern of the predetermined wired circuit pattern.

(b) shows the process of forming the conductor layer of the predetermined wired circuit pattern on the insulating base layer at portions thereof where the plating resist is not formed; and (c) shows the process of removing the plating resist by etching.

(a) shows the process of forming a coating on the insulating base layer and the metal coating film.

(b) shows the process of exposing the coating to light.

(c) shows the process of developing the coating; and (d) shows the process of curing the coating.

DETAILED DESCRIPTION OF THE PREFERRED EMBODIMENTS

Figure 1:
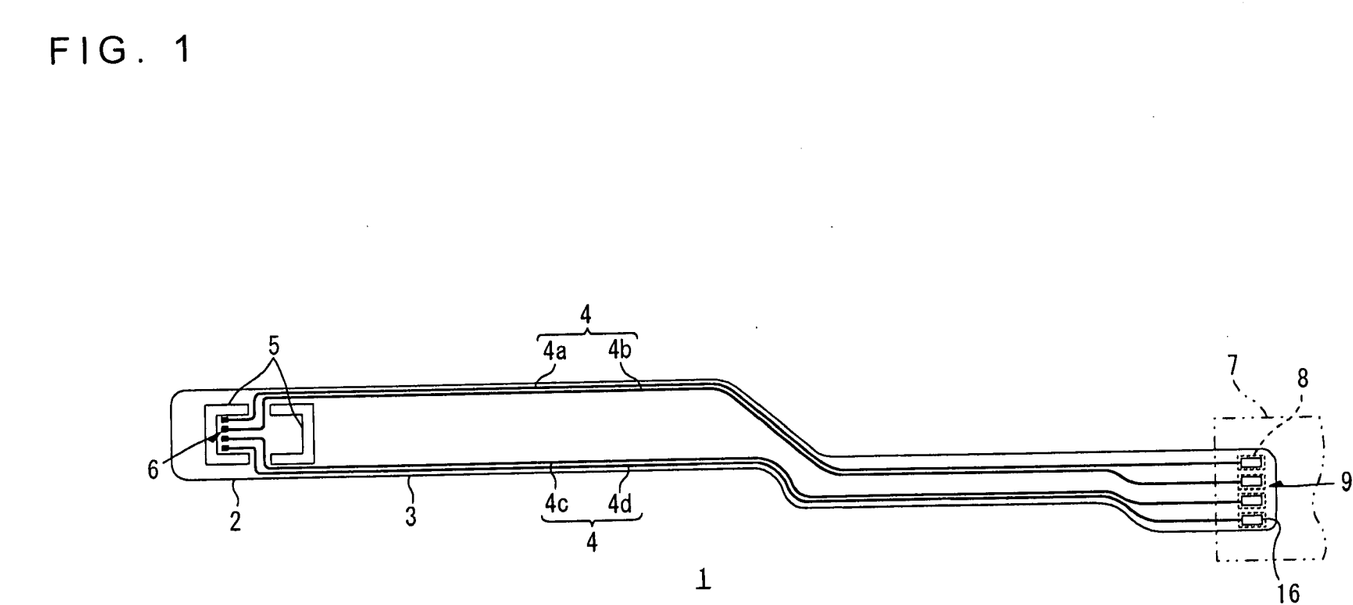
FIG. 1 is a plan view showing an embodiment of a suspension board with circuit of the present invention.

Referring to FIG. 1, there is shown a plan view showing an embodiment of a suspension board with circuit of the present invention. This suspension board with circuit mounts thereon a magnetic head of a hard disk drive (not shown) and supports the magnetic head, with a minute interval between the magnetic head and a magnetic disk held against an airflow generated when the magnetic head and the magnetic disk run relative to each other. The suspension board with circuit has the lines of wire, integrally formed in the form of a specific circuit pattern, for connecting the magnetic head and the read/write board formed as an external circuit.

In FIG. 1, in the suspension board with circuit 1, an insulating base layer 3 of insulating material, serving as an insulating layer, is formed on a suspension board 2, serving as a metal support layer, extending longitudinally of the suspension board with circuit. A conductor layer 4 formed in the form of a specific circuit pattern is formed on the insulating base layer 3. The wired circuit pattern is in the form of a plurality of lines of wire 4a, 4b, 4c and 4d arrayed in parallel with each other and spaced apart at a predetermined interval.

The suspension board 2 is provided, at a front end portion thereof, with gimbals 5 for fitting the magnetic heads therein which are formed by cutting out the suspension board 2. It is also provided, at the front end portion thereof, with a magnetic head connection terminal portion 6 for connecting between the magnetic head and the lines of wire 4a, 4b, 4c and 4d.

Also, the suspension board 2 is provided, at a rear end portion thereof, with an external connection terminal portion 9 serving as a terminal portion for connecting between terminals 8 of a read/write board 7 and the lines of wire 4a, 4b, 4c and 4d. The external connection terminal portion 9 is formed in such a manner that an insulating cover layer 10 mentioned later is opened to have generally rectangle-shaped pad openings 11 corresponding to the lines of wire 4a, 4b, 4c, and 4d at the rear ends of the lines of wire 4a, 4b, 4c, and 4d, and then pad portions 16, each comprising a gold plated layer 24 and a nickel plated layer 23, are formed on the conductor layer 4 exposed in the pad openings 11.

In practice, the insulating cover layer 10 formed of the insulating material is coated over the conductor layer 4, though not shown in FIG. 1.

In this suspension board with circuit 1, as shown in FIG. 3(i), a first opening 25 is formed in the suspension board 2, and a second opening 12 is formed in the insulating base layer 3 to be encompassed with the first opening 25 without contacting with a periphery of the first opening 25. A thin metal film 13 is exposed in the second opening 12.

Next, the method of producing this suspension board with circuit 1 will be described in detail with reference to FIGS. 2–6. In FIGS. 2–6, a part of the suspension board with circuit 1, including an area where the external connection terminal portion 9 is formed, is shown in section taken along a longitudinal direction of the suspension board with circuit 1.

In this method, as shown in FIG. 2(a), the suspension board 2 is prepared, and the insulting base layer 3 in which the second opening 12 is formed is formed in a specific pattern on the suspension board 2.

A metal foil or a thin metal sheet is preferably used as the suspension board 2. For example, stainless steel, 42 alloy and the like are preferably used. The suspension board used preferably has a thickness of 10–60 μm, preferably 15–30 μm, and a width of 50–500 mm, or preferably 125–300 mm.

Any insulating material may be used for forming the insulating base layer 3 without any particular limitation, as long as it may be used as the insulating material for the suspension board with circuit. The insulating materials include, for example, synthetic resins, such as polyimide resin, acrylic resin, polyether nitrile resin, polyether sulfonic resin, polyethylene terephthalate resin, polyethylene naphthalate resin and polyvinyl chloride resin. Of these synthetic resins, a photosensitive synthetic resin is preferably used as the insulating base layer 3. The photosensitive polyimide resin is further preferably used.

Figure 4:
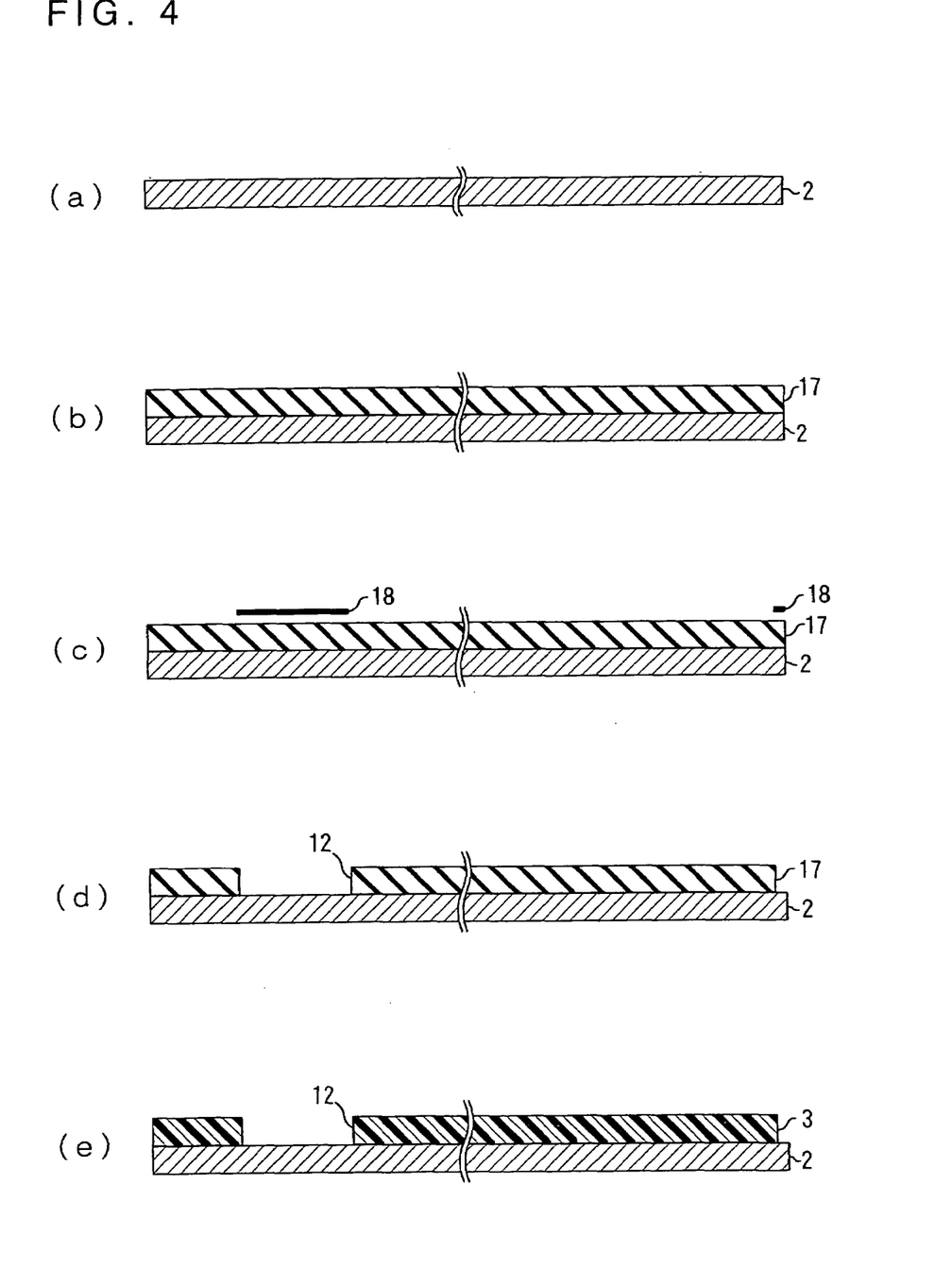
FIG. 4 is a process drawing illustrating the details of the process of forming the insulating base layer in a predetermined pattern in FIG. 2(a)

Then, for example in the case where the insulating base layer 3 is formed in the specific pattern including the second opening 12 on the suspension board 2 using photosensitive polyimide resin, the suspension board 2 is prepared as shown in FIG. 4(*a*), first, and then liquid solution of precursor of the photosensitive polyimide resin (polyamic acid resin) is applied to the entire surface of the suspension board 2 prepared as shown in FIG. 4(*b*), and then is heated at e.g. 60–150° C., or preferably at 80–120° C., to form a coating 17 of the precursor of the photosensitive polyimide resin.

Then, the coating 17 is exposed to light through a photo mask 18, as shown in FIG. 4(*c*). If required, the exposed part is heated to a certain temperature. Thereafter, the coating is developed to form the coating 17 into a specific pattern including the second opening 12, as shown in FIG. 4(*d*). Preferably, radiation irradiated through the photo mask 18 has an exposure wavelength of 300–450 nm, or preferably 350–420 nm. An integrated quantity of exposure light is preferably in the range of 100–1,000 mJ/cm$^2$, or preferably in the range of 200–700 mJ/cm$^2$.

When the exposed part of the coating 17 irradiated is heated at e.g. 130° C. or more to less than 150° C., it is solubilized (positive type) in the next developing procedure. On the other hand, when heated at e.g. 150° C. or more to 180° C. or less, it is insolubilized (negative type) in the next developing procedure. The development can be performed by any known method, such as a dipping process and a spraying process, using a known developing solution such as alkaline developer. Preferably, the producing method uses the negative type to produce the pattern. Illustrated in FIG. 4 is an embodiment using the process steps of negative type for the patterning.

As shown in FIG. 4(*e*), the coating 17 of the precursor of the photosensitive polyimide resin thus patterned is finally heated to e.g. 250° C. or more to be cured (imidized), whereby the insulating base layer 3 of polyimide resin is formed in the specific pattern including the second opening 12.

In the case where the photosensitive synthetic resin is not used, synthetic resin is applied to the suspension board 2 in the specific pattern or the synthetic resin in the form of a dry film is bonded thereto. In this case, the second opening 12 is formed by a known method, such as punching, drilling, laser machining, and etching, after the synthetic resin is applied to or the dry film is bonded to the suspension board 2 (or before the dry film is bonded to the suspension board 2).

Preferably, the insulating base layer 3 thus formed has thickness of e.g. 2–30 μm, or preferably 5–20 μm. The second opening 12 can take any proper form, such as a circular form and a rectangular form, without any particular limitation. In the case of the second opening of a circular form, it preferably has a diameter of e.g. 30–2,000 μm, or preferably 60–1,000 μm. In the case of the second opening of a rectangular form, a side of the rectangle is preferably 30–2,000 μm, or preferably 60–1,000 82 m.

Figure 2:
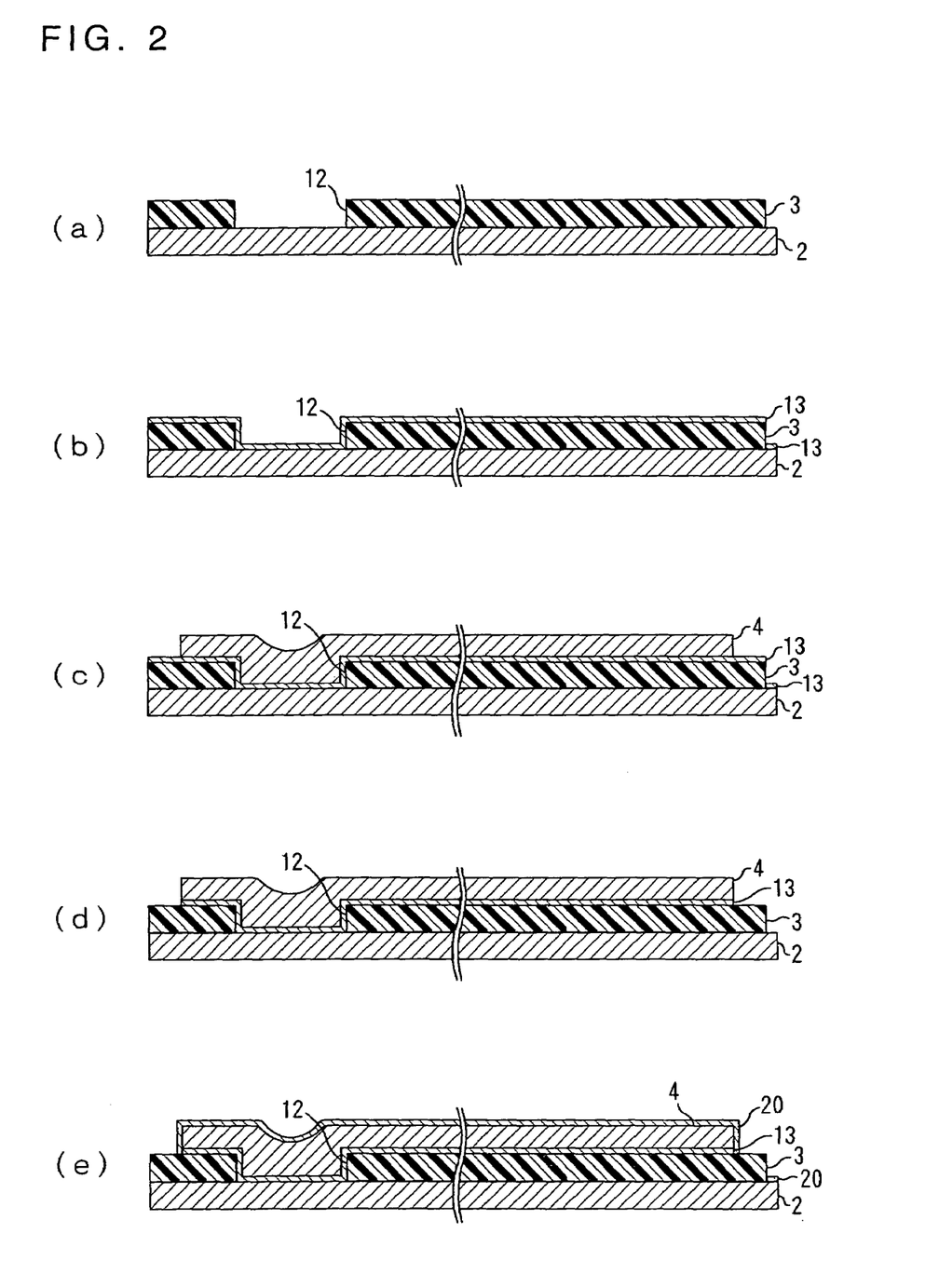
FIG. 2 is a process drawing showing an embodiment of a producing method of a suspension board with circuit shown in FIG. 1.

Then, a thin metal film 13 is formed on the entire surface of the insulating base layer 3 and on the surface of the suspension board 2 including the second opening 12 exposed from the insulting base layer 3, as shown in FIG. 2(*b*).

The thin metal film 13 is formed using a vacuum deposition process, or preferably using a sputtering deposition process. Chromium and copper are preferably used as the metal to be formed into the thin metal film 13. To be more specific, a thin chrome film and a thin copper film are preferably formed in sequence on the entire surface of the insulating base layer 3 and on the surface of the suspension board 2 including the second opening 12 exposed from the insulating base layer 3 using a sputtering deposition process.

Preferably, the thin chrome film has thickness of 100–600 Å and the thin copper film has thickness of 500–2,000 Å.

Sequentially, the conductor layer 4 is formed in the form of a specific circuit pattern on the thin metal film 13, as shown in FIG. 2(*c*).

The conductor layer 4 is formed of a conductive material. Any conductive material may be used for the conductor layer 4 without any particular limitation, as long as it may be used as the conductive material for the suspension board with circuit. The conductive materials that may be used include, for example, copper, nickel, gold, solder or alloys thereof Copper is preferably used for the conductor layer.

Figure 5:
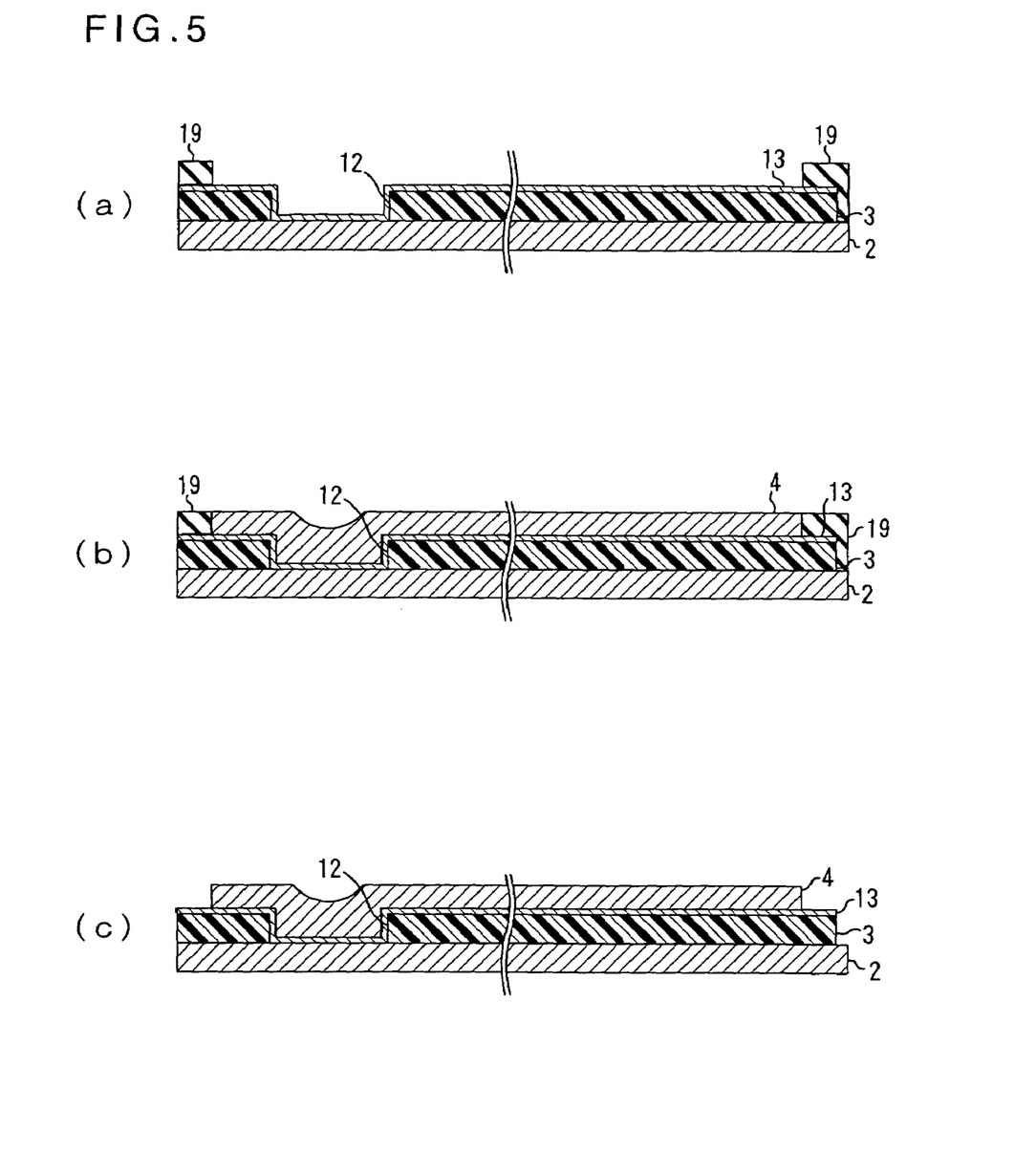
FIG. 5 is a process drawing illustrating the details of the process of forming the conductor layer in the form of a predetermined wired circuit pattern on the thin metal film of FIG. 2(c)

The conductor layer 4 is formed in the specific wired circuit pattern in the following way. First, as shown in FIG. 5(*a*), a plating resist 19 with a reversed pattern of the specific wired circuit pattern is formed on the thin metal film 13. The plating resist 19 is formed in the form of a specific resist pattern by a known process using a dry film photoresist, for example. Then, as shown in FIG. 5(*b*), the conductor layer 4 of the specific wired circuit pattern is formed by plating on an area of the insulating base layer 3 where the plating resist 19 is not formed. Either of the electrolysis plating and the electroless plating may be used to form the conductor layer 4. Among them, the electrolysis copper plating is preferably used.

This wired circuit pattern is, for example, in the form of a pattern shown in FIG. 1 formed by a plurality of lines of wire 4*a*, 4*b*, 4*c* and 4*d* extending along a longitudinal direction of the suspension board with circuit 1 and spaced apart in parallel with each other with a given interval. The wired circuit pattern is electrically conductive with the suspension board 2 through the thin metal film 13 in the second opening 12.

It is preferable that the conductor layer 4 has thickness of e.g. 2–15 μm or preferably 5–10 μm, and that the lines of wire 4*a*, 4*b*, 4*c* and 4*d* have each width of e.g. 10–500 μm or preferably 30–200 μm. The interval between the adjacent lines of wire 4*a*, 4*b*, 4*c* and 4*d* is e.g. 10–200 μm or preferably 30–100 μm.

Then, the plating resist 19 is removed by a known etching process, for example, such as a chemical etching (wet etching), or by stripping, as shown in FIG. 5(*c*).

Then, the part of the thin metal film 13 exposed from the conductor layer 4 (i.e. the part of the thin metal film 13 on which the plating resist 19 was formed) is likewise removed by a known etching process, such as the chemical etching (wet etching) process, as shown in FIG. 2(*d*).

Thereafter, a metal coating 20 is formed on a surface of the conductor layer 4 and on a surface of the suspension board 2, as shown in FIG. 2(*e*). Preferably, the metal coating 20 is formed in the form of a hard, thin nickel coating by electroless nickel plating. It suffices to have thickness enough to prevent the surface of the conductor layer 4 from being exposed. For example, the thickness of the order of e.g. 0.05–0.1 μm can be cited as the preferable one.

Figure 3:
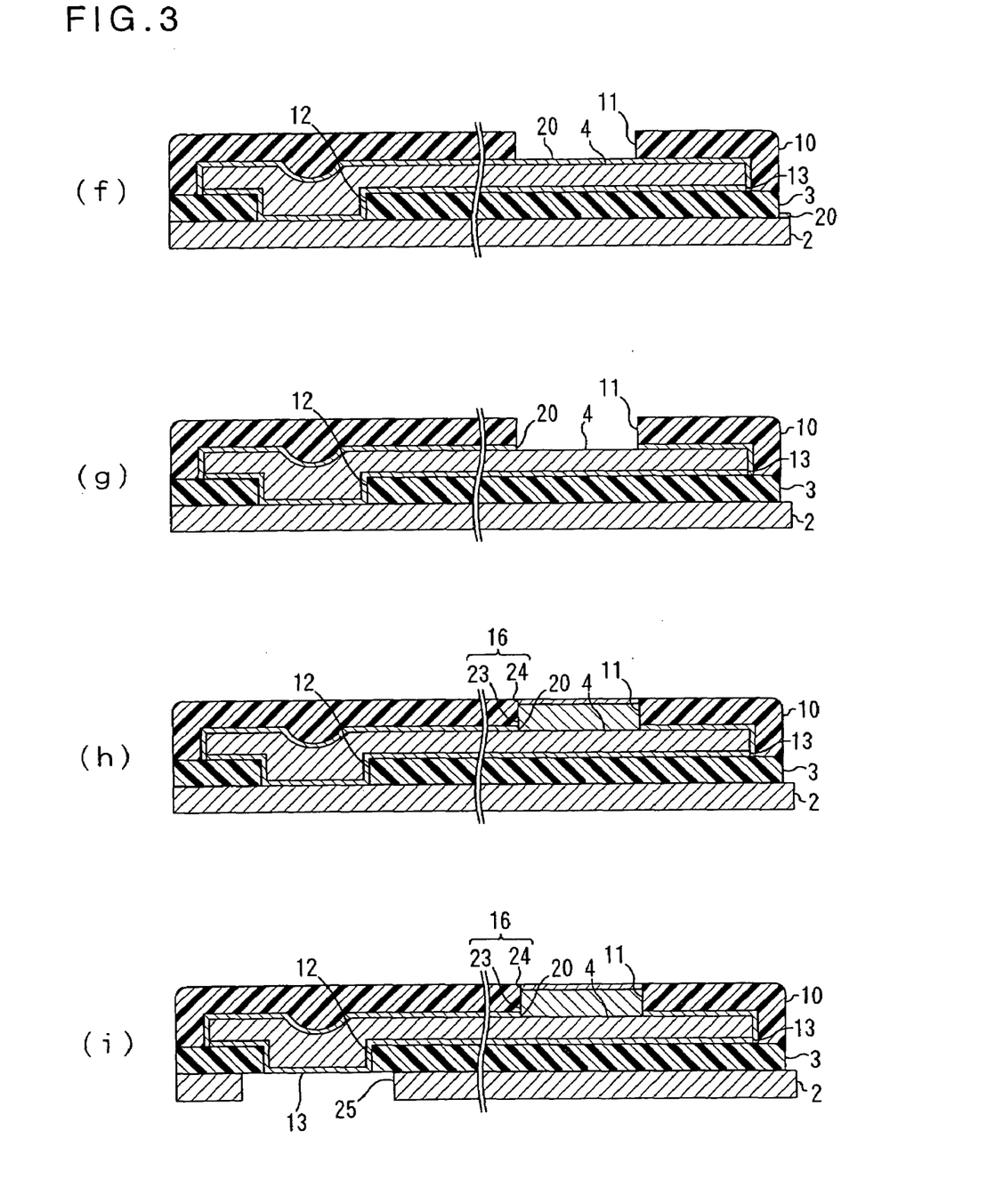
FIG. 3 is a process drawing following FIG. 2, showing the embodiment of the producing method of the suspension board with circuit shown in FIG. 1.

Sequentially, an insulating cover layer 10 for covering the conductor layer 4 is formed in a specific pattern, as shown in FIG. 3(*f*). The same insulating material as that for the insulating base layer 3 is used for forming the insulating cover layer 10. Preferably, photosensitive polyimide resin is used.

Figure 6:
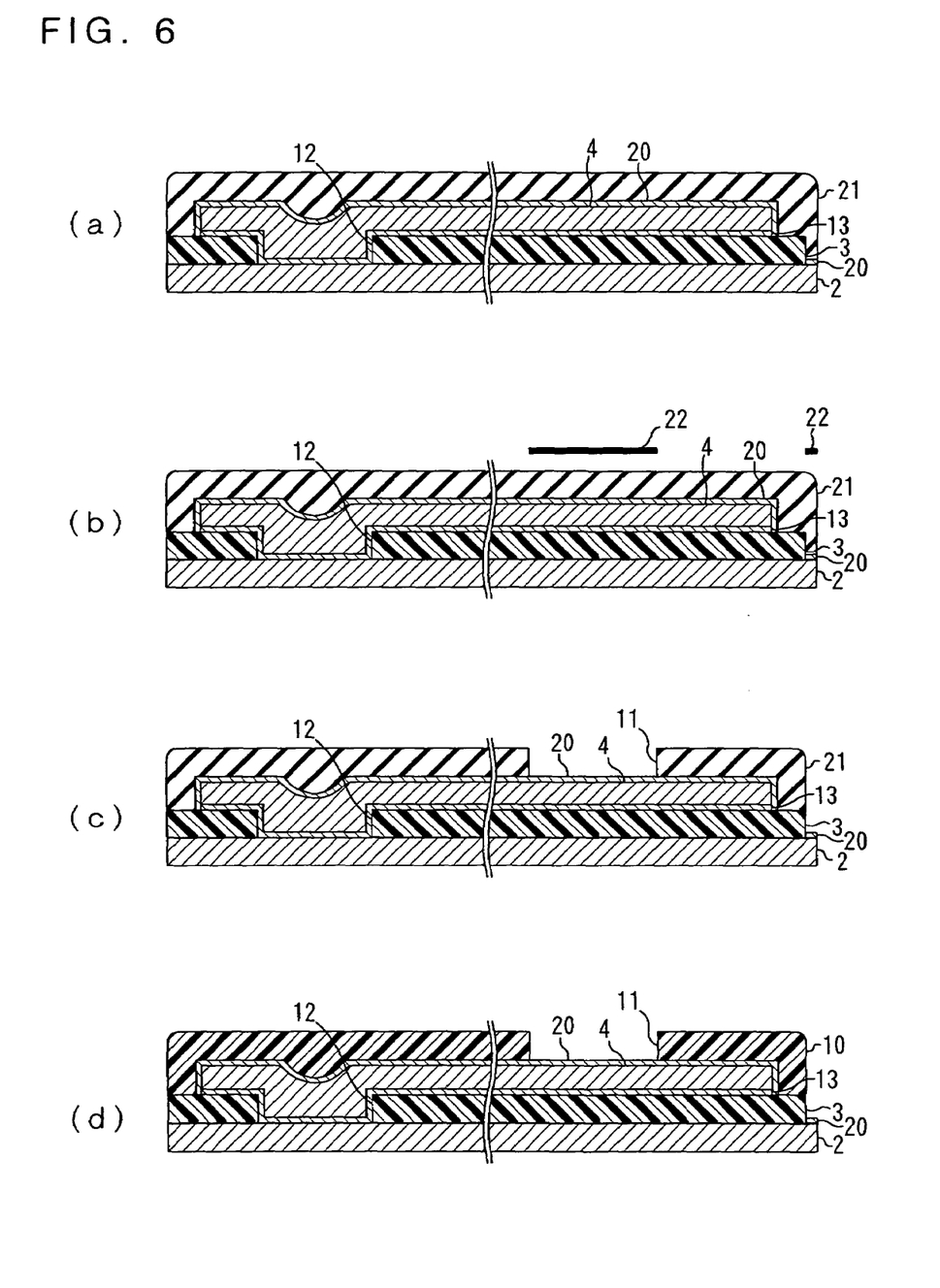
FIG. 6 is a process drawing illustrating the details of the process of forming an insulating cover layer in the form of a predetermined pattern in FIG. 3(f)

When the insulating cover layer 10 is formed using e.g. the photosensitive polyimide resin, liquid solution of precursor of the photosensitive polyimide resin (polyamic acid resin) is applied to the entire surface of the insulating base layer 3 and the metal coating 20, as shown in FIG. 6(*a*), and then is heated at e.g. 60–150° C., or preferably at 80–120°

C., to form a coating 21 of the precursor of the photosensitive polyimide resin. Then, the coating 21 is exposed to light through the photo mask 22, as shown in FIG. 6(b). If required, the exposed part is heated to a certain temperature. Thereafter, the coating 21 is developed and thereby is patterned so that the conductor layer 4 can be covered with the coating 21, as shown in FIG. 6(c). When the coating 21 is patterned, the coating 21 is opened in its area where the pad portion 16 is to be formed, to form pad openings 11 from which the conductor layer 4 is exposed. The coating 21 can be exposed and developed under the same condition as the condition for exposing and developing the insulating base layer 3. The patterning of the coating 21 is preferably produced with the negative type. Shown in FIG. 6 is an embodied form in which the coating 21 is patterned with the negative type.

Then, as shown in FIG. 6(d), the coating 21 of the precursor of the photosensitive polyimide resin thus patterned is finally heated, for example, to 250° C. or more to be cured (imidized), whereby the insulating cover layer 10 of polyimide resin is formed on the conductor layer 4. The insulating cover layer 10 has thickness of e.g. 1–30 μm, or preferably 2–5 μm.

Sequentially, the metal coating 20 exposed in the pad opening 11 is stripped, as shown in FIG. 3(g). At the same time, the metal coating 20 formed on the suspension board 2 is also stripped.

Then, the pad portion 16 is formed on the surface of the conductor layer 4 exposed from the pad opening 11 by electrolysis plating, as shown in FIG. 3(h). Any metal may be used for the electrolysis plating, without any particular limitation, as long as it can form the terminal portion of the suspension board with circuit. For example, copper, nickel, chromium and gold are preferably used.

The pad portion 16 can be formed by the electrolysis plating in the following process, for example. First, the suspension board 2 and the insulating cover layer 10 are all covered with a resist, except an area where the pad portion 16 is to be formed. In this process, since the conductor layer 4 is electrically conductive with the suspension board 2 through the thin metal film 13 in the second opening 12, the suspension board 2 can be used as the lead portion of the electrolysis plating.

The pad portions 16 may be formed in multilayer. For example, as shown in FIG. 3(h), the electrolysis nickel plating and the electrolysis gold plating are carried out in sequence to form the nickel plated layer 23 and the gold plated layer 24 in sequence. Preferably, the nickel plated layer 23 and the gold plated layer 24 have each thickness of the order of 1–5 μm.

Thereafter, the suspension board 2 is cut out into a predetermined shape including a gimbal 5 by a known process such as the chemical etching. In this cutting process, the first opening 25 surrounding the second opening 12 is also formed in the suspension board 2 at its portion corresponding to the second opening 12, as shown in FIG. 3(i).

In order to prevent the conductor layer 4 from being short-circuited via the suspension board 2 and thin metal film 13, the first opening 25 is formed to be larger than the second opening 12 so as not to contact with the periphery of the second opening 12. Before the first opening 25 is formed in the suspension board 2, the conductor layer 4 is filled in the second opening 12 and is electrically conductive with the suspension board 2 via the thin metal film 13. This can produce the result that the surface of the thin metal film 13 exposed in the second opening 12 comes to be flush with the surface of the insulating base layer 3 exposed in the first opening 25.

The first opening 25 can take any proper form, such as a circular form and a rectangular form, without any particular limitation. In the case of the first opening 25 of a circular form, it preferably has a diameter of e.g. 30–2,000 μm, or preferably 60–1,000 μm. In the case of the first opening 25 of a rectangular form, a side of the rectangle is preferably 30–2,000 μm, or preferably 60–1,000 μm.

Although the process of forming the magnetic head connection terminal portion 6 has not been described above, the magnetic head connection terminal portion 6 is also formed in the same process as the process of forming the external connection terminal portion 9.

According to the suspension board with circuit 1 thus produced, in the process of forming the pad portion 16 by the electrolysis plating before the process of forming the first opening 25, the suspension board 2 is electrically conductive with the conductor layer 4 via the thin metal film 13, as shown in FIG. 3(h). Hence, the suspension board 2 can be used as the lead portion of the electrolysis plating for forming the pad portion 16 in this process.

Also, when the suspension board with circuit 1 is produced in this method, the conductor layer 4 is covered with the thin metal film 13 without being exposed directly from the second opening 12 and thus is prevented from being exposed to outside. This can prevent occurrence of corrosion or defects of the conductor layer 4 effectively. Besides, since this method does not require the process of removing the lead portion after the pad portion 16 is formed, the number of processes can be reduced, resulting in improvement in production efficiency and reduction in cost.

Figure 7:
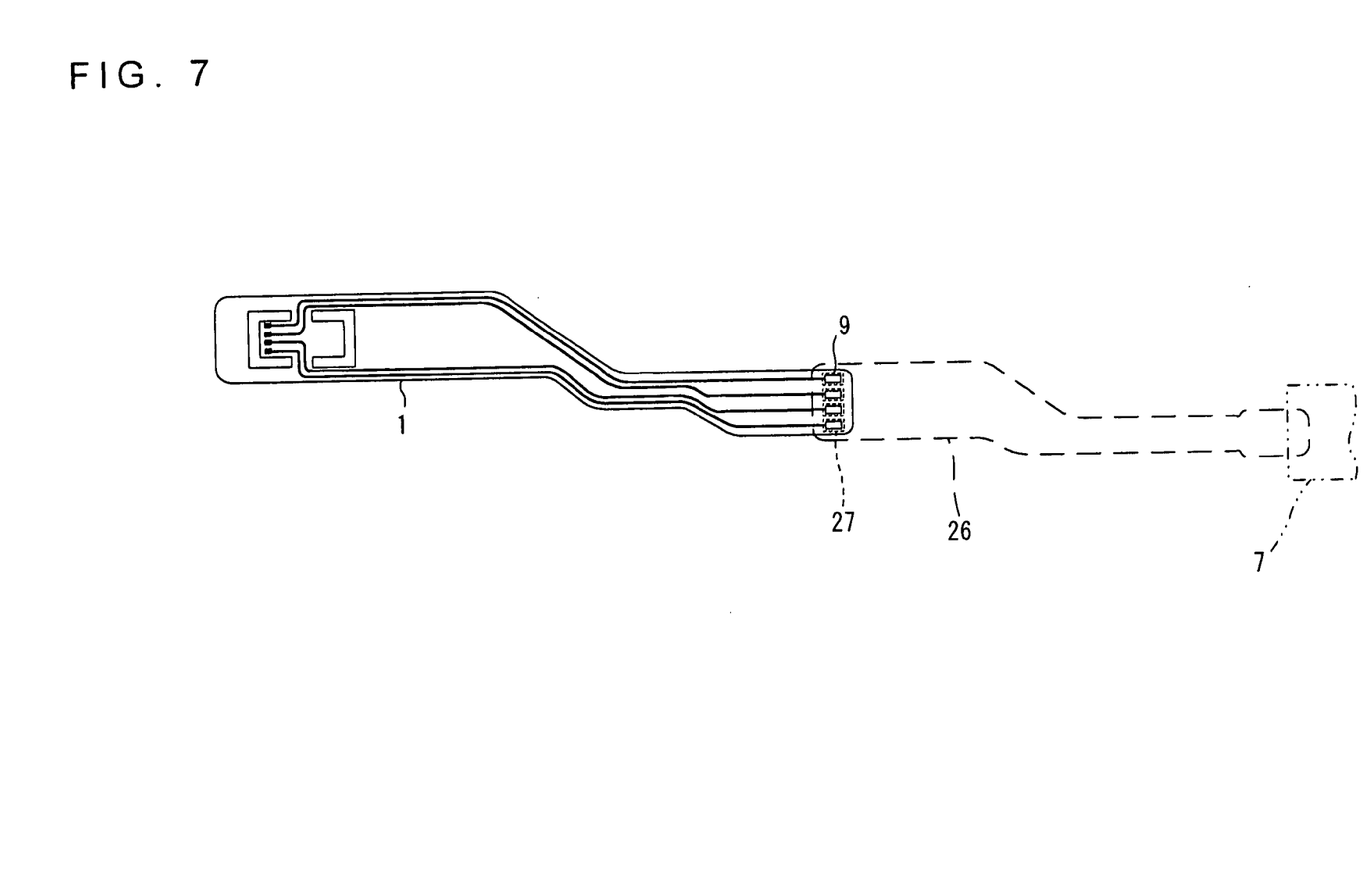
FIG. 7 is a plan view of another embodiment (short-tail type) of a suspension board with circuit of the present invention.

While the suspension board with circuit 1 of the embodiments mentioned above is the so-called long tail type one in which the external connection terminal portion 9 is connected to the terminal 8 of the read/write board 7, the suspension board with circuit of the present invention is not limited thereto. For example, it may be the so-called short tail type one, as shown in FIG. 7. In the short tail type of suspension board with circuit 1, the suspension board with circuit 1 is connected to the read/write board 7 through a junction board 26 and the external connection terminal portion 9 of the suspension board with circuit 1 is connected to terminals 27 of the junction board 26.

EXAMPLE

While in the following, the present invention will be described in further detail with reference to Example, the present invention is not limited to Example.

(Production of Suspension Board with Circuit)

Liquid solution of polyamic acid resin was applied on the stainless foil having thickness of 25 μm and then heated at 130° C. to thereby form a coating of the polyamic acid resin. Sequentially, the coating was exposed to light (405 nm, 1,500 mJ/cm$^2$) through the photo mask. The exposed part was heated to 180° C. and then developed using alkaline developer, whereby the coating was formed in the specific pattern including the second opening with the negative image.

Sequentially, the patterned coating of the polyamic acid resin was heated at 350° C. to be cured (imidized), whereby the insulating base layer of polyimide resin of thickness of 15 μm was formed in the specific pattern including the second opening. The second opening was formed in a circular shape having a size of 60 μm.

Sequentially, a thin chrome film having thickness of 300 Å and a thin copper film having thickness of 700 Å were formed in sequence on the entire surface of the insulating base layer and on the surface of the suspension board including the second opening exposed from the insulating base layer by the sputtering deposition process. Thereafter, the plating resist having the reversed pattern of the specific wired circuit pattern was formed by using the dry film photoresist, and the conductor layer having the specific wired circuit pattern was formed in the part of the insulating base layer where the plating resist was not formed, by the electrolysis copper plating. Thereafter, the plating resist was removed by chemical etching and then the thin chromium film and the thin copper film on which the plating resist had been formed were removed by chemical etching. The conductor layer was formed to have thickness of 20 μm and was formed in the pattern formed by four lines of wire each having width of 20 μm and arranged in parallel with each other with spaced apart at interval of 30 μm.

Sequentially, a hard, nickel coating having thickness of 0.1 μm was formed on the surface of the conductor layer and on the surface of the stainless foil by the electroless nickel plating. Thereafter, liquid solution of polyamic acid resin was applied to the nickel coating and the insulating base layer and then heated at 130° C. to thereby form a coating of the polyamic acid resin. Sequentially, the coating was exposed to light (405 nm, 1,500 mJ/cm$^2$) through the photo mask. The exposed part was heated to 180° C. and then developed using alkaline developer, whereby the coating was patterned so that the conductor layer could be covered with the coating. Sequentially, the patterned coating of the polyamic acid resin was heated at 350° C. to be cured (imidized), whereby the insulating cover layer formed of polyimide resin of thickness of 3 μm was formed on the conductor layer. In order to form the pad openings in the insulating cover layer, the insulating cover layer was not formed on any areas of the conductor layer where the pad portions of the magnetic head connection terminals and external connection terminals were to be formed.

Thereafter, the nickel coating formed on the surface of the stainless foil and on the conductor layer in the pad openings of the magnetic head connection terminals and external connection terminals was stripped. Then, the pad portions, each comprising the nickel plated layer having thickness of 2 μm and the gold plated layer having thickness of 1 μm, were formed in the pad openings by carrying out the electrolysis nickel plating and the electrolysis gold plating in sequence using the stainless foil as the lead portion of the electrolysis plating.

Thereafter, the stainless foil was cut out in a specific form by chemical etching. The suspension board with circuit was produced in the manner mentioned above. In the cutting process, the first opening surrounding the second opening was formed in the stainless foil at a portion thereof corresponding to the second opening. The first opening had a similar form with the second opening and has a size of 140 μm, being larger than the second opening.

Evaluation

The suspension board with circuit thus produced was allowed to stand in the atmosphere of temperature of 85° C. and humidity of 85% for 1,000 hours, to observe deterioration of the suspension board with circuit. No tarnish and deformation of the wired circuit pattern and no deterioration of electric properties of the same were found from the observation.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A suspension board with circuit comprising:
    a metal support layer,
    an insulating layer formed on the metal support layer,
    a thin metal film formed on the insulating layer, and
    a conductor layer formed on the thin metal film,
    wherein a first opening is formed in the metal support layer, and
    a second opening is formed in the insulating layer to be encompassed with the first opening without contacting with a periphery of the first opening, and
    wherein the thin metal film is exposed in the second opening; and
    wherein the thin metal film that is exposed in the second opening is formed so that its surface is flush with and coplanar with a surface of the insulating layer that is exposed in the first opening.

2. The suspension board with circuit according to claim 1, further comprising:
    an insulating cover layer formed on the conductor layer; and
    a pad portion formed in a pad opening in the cover layer.

3. The suspension board with circuit according to claim 2, wherein one of a metal coating and the thin metal film is formed on an entire surface of the conductor layer, except for an area where the pad portion is formed.

4. A method of producing a suspension board with circuit comprising:
    forming an insulating layer having a second opening on a metal support layer;
    forming a thin metal film on the insulating layer and on the metal support layer exposed in the second opening;
    forming a conductor layer on the thin metal film in the form of a wired circuit pattern;
    forming a terminal portion on the conductor layer by electrolysis plating using the metal support layer as a lead portion of the electrolysis plating;
    forming a first opening in the metal support layer at a portion thereof corresponding to the second opening so that the first opening surround the second opening without contacting with a periphery of the second opening; and
    forming the thin metal film to include an exposed surface that is flush with and coplanar with a surface of the insulating layer that is exposed in the first opening.

5. A suspension board with circuit comprising:
    a metal support layer;
    an insulating layer formed on the metal support layer;
    a thin metal film formed on the insulating layer;
    a conductor layer formed on the thin metal film;
    a cover layer formed on the conductor layer;
    a pad portion formed in a pad opening in the cover layer;
    wherein a first opening is formed in the metal support layer;
    a second opening is formed in the insulating layer to be encompassed with the first opening without contacting with a periphery of the first opening; and wherein the pad portion is formed in the cover layer at a position that is lateral to the second opening so that there is no overlap in a vertical direction between the second opening and the pad portion, wherein the thin metal film that is exposed in the second opening is formed so that its surface is flush with and coplanar with a surface of the insulating layer that is exposed in the first opening.

* * * * *